United States Patent [19]

Ovchinnikov et al.

[11] 4,431,724
[45] Feb. 14, 1984

[54] OFFSET PRINTING PLATE AND PROCESS FOR MAKING SAME

[76] Inventors: Jury M. Ovchinnikov, Baltiisky pereulok, 3/25, kv. 36, Moscow; Valentina G. Solokhina, ulitsa Gotvalda, 14, kv. 48, Moscow; Xenia G. Samoshenkova, Kozhukhovskaya ulitsa, 16, kv. 84, Moscow; Veniamin S. Lapatukhin, Teply stan, mikroraion 1a, korpus 16, kv. 16, Moscow; Julia I. Belyaeva, Snaiperskaay ulitsa, 10, korpus 1, kv. 214, Moscow; Genrietta Y. Krikman, Bolshevistsky pereulok, 9, kv. 23, Moscow; Izabella I. Guschina, ulitsa Korneichuka, 22, kv. 26, Moscow; Nikolai N. Krutikov, Jubileiny prospekt 76, kv. 14, Khimki Moskovskoi oblasti; Ljubov I. Sulakova, Ferganskaya ulitsa, 13, korpus 2, kv. 55, Moscow, all of U.S.S.R.

[21] Appl. No.: 356,900

[22] Filed: Mar. 10, 1982

Related U.S. Application Data

[62] Division of Ser. No. 222,971, Jan. 7, 1981.

[51] Int. Cl.$^3$ .............................................. G03F 7/08
[52] U.S. Cl. ..................................... 430/302; 430/165; 430/275; 430/276; 430/309; 430/331; 101/456; 101/458; 101/465
[58] Field of Search ............... 430/275, 276, 165, 302, 430/309, 192, 331; 101/456, 458, 465

[56] References Cited

U.S. PATENT DOCUMENTS

| | | | |
|---|---|---|---|
| 2,441,653 | 6/1948 | Van Dusen | 430/275 |
| 2,791,504 | 5/1957 | Plambeck | 430/275 |
| 3,046,118 | 7/1962 | Schmidt | 430/193 |
| 3,201,239 | 8/1965 | Neugebauer et al. | 430/165 |
| 3,475,171 | 10/1969 | Alles | 430/331 |
| 3,676,125 | 7/1972 | de Haes | 430/302 |
| 3,891,439 | 6/1975 | Katz et al. | 430/331 |
| 4,043,811 | 8/1977 | Pratt | 430/104 |
| 4,197,128 | 4/1980 | Watanabe et al. | 430/166 |
| 4,263,387 | 4/1981 | Martinez | 430/94 |
| 4,307,404 | 1/1983 | Tachikawa et al. | 430/302 |
| 4,347,289 | 8/1982 | Colegrove | 430/309 |

FOREIGN PATENT DOCUMENTS 2828891 1/1979 Fed. Rep. of Germany ...... 430/300

OTHER PUBLICATIONS

Kosar, J., "Light-Sensitive Systems", J. Wiley & Sons, 1965, pp. 119, 120 and 127.

*Primary Examiner*—Charles L. Bowers, Jr.
*Attorney, Agent, or Firm*—Steinberg & Raskin

[57] ABSTRACT

An offset printing plate is provided comprising a carbon steel substrate with printing and non-printing areas on its surface. The printing areas are made of a light-sensitive top layer material based on derivatives of ortho-naphthoquinonediazide-sulphonic or carboxylic acids or a light-sensitive top layer material comprising a photopolymerizable composition. These printing areas form a relief over the plate surface. The non-printing areas are made of a hydrophilized metal of the substrate hydrophilized carbon steel.

A process for making an offset printing plate comprises application, onto a carbon steel substrate, of a light sensitive top layer based on derivatives of ortho-naphthoquinonediazide-sulphonic or carboxylic acids or a light-sensitive top layer comprising a photopolymerizable composition. The thus-applied top layer is dried. Onto the dried top layer an image is transferred from a photo-mask, a diapositive in the case of using a top layer based on derivatives of ortho-naphthoquinonediazide-sulphonic or carboxylic acids, and from a negative in the case of using a top layer comprising a photopolymerizable composition. The image is developed by removing regions of the top layer from the non-printing areas by means of a 0.2–1.5% aqueous solution of alkali metal salts or alkali metal hydroxides at a temperature ranging from 18° to 25° C. The non-printing areas are hydrophilized by means of an aqueous solution containing 5 to 10% of a salt formed by an alkali metal and a cyanide inorganic complex, and 0.5 to 2% of an organic hydrophilic colloid at a temperature ranging from 20° to 50° C.

The offset printing plate according to the present invention features a simple structure and a high mechanical strength. A tensile strength of a carbon steel substrate ranges from 32 to 36 kgf/mm$^2$. Wear-resistance of the non-printing areas is about 0.05 mm$^3$/cm$^2$. The offset printing plate according to the present invention can withstand press runs of about 250,000 prints.

6 Claims, No Drawings

OFFSET PRINTING PLATE AND PROCESS FOR MAKING SAME

This is a division of application Ser. No. 222,971, filed Jan. 7, 1981.

FIELD OF THE INVENTION

The present invention relates to the printing industry and, more specifically to offset plates and processes for manufacturing the same. These offset printing plates can be used for printing books, magazines, post-cards, placards, etc.

BACKGROUND OF THE INVENTION

Known in the art are offset printing plates made of aluminium substrates. The non-printing areas of such substrates are made of oxidized aluminium and as the printing areas use is made of a material of a light-sensitive top layer based on derivatives of ortho-naphthoquinonediazide-sulphonic or carboxylic acids or a material of a light-sensitive top layer comprising a photopolymerizable composition. The printing areas of these plates are positioned above the non-printing areas, their height being 2-3 $\mu$m(cf. FRG Pat. No. 2,622,799 Cl. G 03 F-H 02; French Pat. No. 2,157,645 Cl. B 41 n 1/00, B 41 n 3/00; FRG Pat. No. 1,238,048 Cl. 15 1 2/02, B 41 n; FRG Pat. No. 1,546,786 Cl. 15 1 2/02, B 41 n 1/08; "Operation Instructions of Offset Printing", "Kniga" Publishing House, Moscow, 1970).

The above-described prior art offset printing plates have an insufficient mechanical strength which is due to a low mechanical strength of an aluminium substrate (tensile strength is 14 to 20 kgf/cm$^2$). This restricts the field of application of these offset printing plates on all kinds of printing equipment, especially web presses. Furthermore, non-printing areas made of oxidized aluminium have a relatively low wear-resistance (the volume of ground-off material from a unit area of a non-printing area is 0.18 mm$^3$/cm$^2$). This lowers the press life of offset printing plates which for the above-mentioned offset plates does not exceed 100,000 prints.

Known in the art are processes for the manufacture of said printing plates comprising preparation of an aluminium plate. The preparation involves degreasing the surface of aluminium, pickling, graining by mechanical or electrochemical methods, oxidation of aluminium by means of direct current and application of an interlayer (or precoat) prior to application of a top layer. After preparation of the aluminium plate, a top layer is deposited thereon and an image is transfered thereto from a photo-mask-a diapositive in the case of a top layer based on derivatives of ortho-naphthoquinonediazide-sulphonic or carboxylic acids or from a negative in the case of a top layer comprising a photopolymerizable composition. After the image development, on the surface of aluminium non-printing areas are uncovered which are subjected to hydrophilization by treating with phosphoric acid. The printing areas comprise the top layer material (cf. French Application No. 2,187,938 Cl. C 23 b 9/02, B 41 n 1/08, French Pat. No. 2,187,622 Cl. B 41 n 1/04, B 41 n 3/04; FRG Pat. No. 2,622,799 Cl. G 03 F-H 02, FRG Pat. No. 1,914,054 Cl. 15 1 2/02).

These prior art process for the manufacture of offset printing plates have disadvantages residing in a multistage character of preparation of the aluminium plate surface. The necessity of such preparation is due, first of all, to the fact that the top layer is fixed on the aluminium plate surface only by adhesion forces, by reason of which the plate surface must have a certain microgeometry. Secondly, for a higher hardness of the aluminium plate surface, oxidation of aluminium is necessary for improvement of press life of non-printing areas. This operation is rather complicated and requires power-consuming galvanic operation necessitating powerful current sources and cooling equipment for lowering the temperature of the electrolyte during oxidation.

Known in the art are offset printing plates comprising an aluminium or steel substrate having printing and non-printing areas thereon which areas are made of two different metals. Usually the printing areas are made of copper and the non-printing ones of chromium. The non-printing areas are positioned above the printing areas at a height of 1-2 $\mu$m. Between the substrate and copper layer there is an intermediate nickel interlayer or a non-metal contact film (cf. French Pat. No. 2,160,089 Cl. B 41 n 1/00, French Pat. No. 2,192,498 Cl. B 41 n 1/00; E. A. Nikanchikova, A. L. Popova "Offset Printing Process", "Kniga" Publishing House, Moscow, 1978).

Non-printing areas made on a harder and wear-resistant metal chromium feature a higher press life (up to 1 mln prints) and abrasion-resistance (the volume of the ground-off metal from a unit area of the non-printing areas is 0.045 mm$^3$/cm$^2$). These offset printing plates have the disadvantage residing in the complicated structure thereof: plates for such forms consist of three basic metal layers (substrate, layer-carrier for non-printing areas and a layer-carrier for printing members) and interlayers ensuring the required adhesion of the basic metal layers to the substrate.

Known in the art are processes for the manufacture of the above-mentioned offset printing plates involving preparation of the surface of a steel or aluminium substrate and build-up of copper and chromium layers thereon. The substrate preparation comprises degreasing by chemical (for aluminium) or electrochemical (for steel) methods, followed by application, thereon of an interlayer to ensure the required adhesion of the subsequent layers. Then onto the prepared substrate there are deposited, electrolytically, first a copper and then a chromium layer to a predetermined thickness using electrolytes having a multi-component composition. Onto the thus-produced multi-metal plate there is deposited a light-sensitive top layer comprising PVA or a photopolymerizable composition. Then the top layer is dried and an image is transferred thereon from a diapositive. The image is developed, whereby the untanned regions of the top layer are removed. The uncovered regions of the multi-metal plate are etched (chemically or electrochemically), to the underlying copper layer. Then the tanned regions are removed from the top layer chemically or electrochemically to reveal chrome regions. Then copper printing areas are subjected to hydrophobization and chromium non-printing areas are subjected to hydrophilization using appropriate solutions (cf. French Pat. No. 2,160,089 Cl. B 41 n 1/00, E. A. Nikanchikova, A. L. Popova "Offset printing Process", "Kniga" Publishing House, Moscow, 1978).

The above-discussed prior art processes for the manufacture of offset printing plates have a disadvantage residing in a multi-stage character for the production of multi-metal plates and the necessity of using solutions of toxic agents for this purpose, as well as a need for special equipment comprising galvanic baths, current sources, ventilation devices, units for neutralization of waste waters. The process for the manufacture of offset printing plates on multi-metal plates is also complicated. Furthermore, etching of chromium to a copper layer on the image-bearing regions inevitably causes distortion of the tone rendering, since side etching occurs along with chromium etching into the depth. The top layer should meet severe requirements: it should be sufficiently acid-resistant in order to protect non-printing areas during acid etching.

BRIEF SUMMARY OF THE INVENTION

It is an object of the present invention to provide a simple structure of an offset printing plate which would have durable non-printing areas with a long press life.

It is another object of the present invention to provide a simple process for the manufacture of an offset printing plate.

These and other objects of the present invention are accomplished by an offset printing plate comprising a metal substrate with printing and non-printing areas on its surface, the printing areas being made of a material of a top layer based on derivatives of ortho-naphthoquiononediazide-sulphonic or carboxylic acids or of a material of a top layer based on a photopolymerizable composition and forming a relief over the plate surface, while the non-printing areas are made of a hydrophilized metal of the plate; in accordance with the present invention the plate is made of a carbon steel and the non-printing areas of a hydrophilized carbon steel.

The offset printing plate according to the present invention has a simple structural arrangement. This printing plate has a high mechanical strength. This is achieved due to the fact that a carbon steel is used as the substrate material which is considerably more durable than aluminium. The tensile strength of carbon steel amounts to 32–36 kgf/mm$^2$, which is twice as high as that of aluminium. Furthermore, non-printing areas made of the substrate material—carbon steel—have a high abrasion-resistance which is substantially not inferior to the abrasion-resistance of chrome non-printing areas (the volume of ground-off material from a unit area of non-printing areas for carbon steel is 0.05 mm$^3$/cm$^2$, that of chromium is 0.045 mm$^3$/cm$^2$). This feature of the offset plate according to the present invention makes it possible to increase press life of the plate by up to 150,000 impressions as compared to an aluminium offset plate.

Non-printing areas made of carbon steel also feature a fine crystal structure thus ensuring a high resolving power of the offset printing plate (up to 250 lines per 1 cm).

The cost of manufacture of the carbon steel offset printing plate according to the present invention is substantially lower compared to that of the above-described prior art offset printing plates.

The objects of the present invention are also accomplished by a process for the manufacture of an offset printing plate comprising application, onto a metal substrate, of a top layer based on derivatives of ortho-naphtoquinonediazide-sulphonic or carboxylic acids or a top layer comprising a photopolymerizable composition; drying this top layer; transfer of an image onto this top layer from a photo-mark-diapositive in the case of a top layer based on derivatives of ortho-naphthoquinonediazide-sulphonic or carboxylic acids, or from a negative in the case of a top layer comprising a photopolymerizable composition; development of the image by the removal of regions of the top layer from the non-printing areas by a 0.2–1.5% aqueous solution of salts of alkali metals or hydroxides of alkali metals at a temperature within the range of from 18° to 25° C.; and hydrophilization of the non-printing areas. In accordance with the present invention, as the metal substrate use is made a carbon steel plate and hydrophilization of the non-printing areas is effected by treatment with an aqueous solution containing 5 to 10% of a salt formed by an alkali metal and a cyanide inorganic complex, and 0.5 to 2% of an organic hydrophilic colloid at a temperature within the range of from 20° to 50° C.

The term "cyanide inorganic complex" as used herein means, as it is generally accepted, the following compounds: $Fe(CN)_6^{-3}$, $Fe(CN)_6^{-4}$, $Co(CN)_6^{-3}$.

In the process according to the present invention, as the salt formed by an alkali metal and a cyanide inorganic complex it is advisable to use sodium or potassium ferrocyanide, ferricyanide and cobaltocyanide.

As the organic hydrophilic colloid it is advisable to use polyvinyl alcohol, polysaccharides such as starch or dextrin, cellulose derivatives such as sodium or potassium salts of carboxymethylcellulose or hydroxyethylcellulose.

To increase press life of the printing areas (up to 200,000–250,000 prints), it is advisable that prior to application of a top layer based on derivatives of orthonaphthoquinonediazide-sulphonic or carboxylic acids onto a carbon-steel plate, the top layer be added with a butylated copolymer of styrene with maleic anhydride, a 50% solution of epoxy resin in ethylcellosolve and a resol-type phenolformaldehyde resin at the mass ratio therebetween of 1:1.5:3 respectively, the additives being introduced in the total amount ranging from 2.2 to 4.4% by mass of the top layer.

The process for the manufacture of the offset printing plate according to the present invention is simple in both its scheme and the equipment employed; the number of process steps is reduced by 1.6 to 2 times as compared to the prior art processes.

DETAILED DESCRIPTION OF THE INVENTION

The offset printing plate of the present invention is manufactured according to the following scheme:

1. Preparation of the surface of a carbon steel plate containing for example 0.08 or 0.15% by mass of carbon. This preparation comprises electrochemical degreasing of the plate surface, etching thereof, treatment with a corrosion inhibiting solution which prevents corrosion of the carbon steel, and drying thereof.

2. Application, onto the carbon steel plate surface, of a top layer based on derivatives of ortho-naphthoquinonediazidesulphonic or carboxylic acids, or a top layer comprising a photopolymerizable composition.

As the derivatives of ortho-naphthoquinonediazide-sulphonic or carboxylic acids use can be made of, for example, an ester of 1,2-naphthoquinone-diazide-(2)-5-sulphonic acid with 4,4'-dioxydiphenylolpropane, an ester of 2,1-naphthquinonediazide-(I)-3-carboxylic acid with 4,4'-dioxydiphenylolpropane, an ester of 1,2-naphthoquinonediazide(2)-4-sulphonic acid with 4,4'-dioxydiphenylolpropane, an ester of 1,2-naphthoquinonediazide (2)-5-sulphonic acid with a novolac resin comprising a product of condensation of 4,4'-dioxydiphenylolpropane with formaldehyde, and ester of 1,2-naphthoquinonediazide (2)-5-sulphonic acid with a phenolformaldehyde novolac resin, octadecylamide-1,2-naphthoquinonediazide (I)-3-carboxylic acid, N-n-butylanilide-1,2-naphthoquinonediazide (I)-3-carboxylic acid, N-benzylanilide-1,2-naphthoquinonediazide (I)-3-carboxylic acid.

The top layer based on derivatives of ortho-naphthoquinonediazide-sulphonic or carboxylic acids consists of the following components, in percent by mass:

| derivative of ortho-naphthoquinonediazide-sulphonic or carboxylic acid | 7.2–13.5 |
|---|---|
| phenylformaldehyde novolac resin | 8.8–14.5 |
| ethylcellosolve | 42–36 |
| dimethylformamide | 42–36. |

To increase press life of the printing areas, it is advisable that the top layer composition based on derivatives of ortho-naphthoquinonediazide-sulphonic or carboxylic acids be added with such agents as a butylated copolymer of styrene with maleic anhydride, a 50% solution of epoxy resin in ethylcellosolve (epoxyphenolic lacquer) and a resol-type phenol-formaldehyde resin at the mass ratio therebetween of 1:1.5:3 respectively; the introduced additive in total amount to 2.2–4.4% by mass of the top layer. In this case the top layer has the following composition, in % by mass:

| ortho-naphthoquinonediazide-sulphonic or carboxylic acid derivative | 5–6 |
|---|---|
| phenolformaldehyde novolac resin | 6.6–7.8 |
| butylated co-polymer of styrene with maleic anhydride | 0.8–0.4 |
| 50% solution of epoxy resin in ethylcellosolve | 1.2–0.6 |
| resol-type phenolformaldehyde resin | 2.4–1.2 |
| ethylcellosolve | 42 |
| dimethylformamide | 42. |

The photopolymerizable top layer composition is as follows, in % by mass:

| copolymer of methylmethacrylate with methacrylic acid | 60 |
|---|---|
| pentaerythritol triacrylate | 13 |
| benzophenone | 5.4 |
| Michler's ketone | 0.12 |
| methylethylketone | 12.48. |

3. Drying of the top layer deposited onto the plate. It should be carried out preferably at a temperature within the range of from 35° to 45° C. for 8–10 minutes for the top layer based on derivatives of ortho-naphthoquinonediazide-sulphonic or carboxylic acids and at a temperature within the range of from 50° to 60° C. for 10 minutes for the top layer comprising a photopolymerizable composition.

4. Transfer of the image onto the top layer from a photo-mask-diapositive- in the case of a top layer based on derivatives of ortho-naphtoquinonediazide-sulphonic or carboxylic acids, or from a negative in the case of a top layer comprising a photopolymerizable composition. This operation is conducted in printing-down frames using actinic radiation sources: metal-halide lamp, arc lamp, xenon lamp. The exposure time at illumination of at least 14,000–16,000 lux and the distance of the light sources from the printing-down frame of 1 m is 5 to 7 minutes.

5. Development of the image on the plate by removing, from the non-printing areas, light-decomposed regions of the top layer based on derivatives of ortho-naphtoquinonediazidesulphonic or carboxylic acids, or by removing, from the non-printing areas, untanned regions of the top layer comprising a photopolymerizable composition. The development is effected by means of a 0.2–1.5% aqueous solution of salts of alkali metals or hydroxides of alkali metals, for example by 0.2–0.3% aqueous solution of caustic potash, 0.8–1.5% aqueous solution of sodium silicate or a 0.5–0.7% aqueous solution of trisodium phosphate at a temperature within the range of from 18° to 25° C.

6. Hydrophilization of the non-printing areas. This operation is conducted by treating the non-printing areas (i.e. the plate regions uncovered after the image development) with an aqueous solution containing 5 to 10% of a salt formed by an alkali metal and a cyanide inorganic complex and 0.5–2% organic hydrophilic colloid such as an aqueous solution containing 5–10% of sodium or potassium ferrocyanide and 1–2% of starch or dextrin; or an aqueous solution containing 5–10% of sodium or potassium ferricyanide and 0.5% of polyvinyl alcohol; or an aqueous solution containing 5–10% of sodium or potassium cobaltocyanide and 0.5–1% of hydroxyethylcellulose or a sodium or potassium salt of carboxymethylcellulose. The hydrophilization is conducted at a temperature within the range of from 20° to 50° C. for 2 to 5 minutes.

For a better understanding of the present invention, some specific examples are given below by way of illustration.

EXAMPLE 1

A plate of carbon steel with the carbon content of 0.08% is electrochemically degreased in a hot alkali solution, etched electrochemically in a solution of chlorides, treated with an aqueous solution containing a salt, a corrosion inhibitor such as sodium nitrite, and dried. Then onto the dry surface of the plate a light-sensitive top layer is applied which has the following composition, in percent by mass:

| ester of 1,2-naphthoquinonediazide(2)-5-sulphonic acid with 4,4'-dioxydiphenylolpropane | 6 |
|---|---|
| phenolformaldehyde novolac resin | 7.8 |
| butylated copolymer of styrene with maleic anhydride | 0.4 |
| 50% solution of epoxy resin in ethylcellosolve (epoxyphenolic lacquer) | 0.6 |
| resol-type phenolformaldehyde resin | 1.2 |
| ethylcellosolve | 42 |
| dimethylformamide | 42. |

After drying of the top layer at a temperature within the range of from 35° to 45° C. for 10 minutes, the image is transferred onto the top layer from a diapositive, whereafter the image is developed by removing the decomposed regions of the top layer from the non-printing areas by treatment with a 1.5% aqueous solution of sodium silicate at a temperature of from 18° to 22° C. Then hydrophilization of the non-printing areas is effected (i.e. the plate regions uncovered after the image development) by treatment with an aqueous solution containing 5% of potassium ferrocyanide and 2% of starch at the temperature of 50° C. for 2 minutes.

EXAMPLE 2

Preparation of the plate, application of the top layer, image transfer, and image development are conducted following the procedure described in the Example 1. Hydrophilization of the non-printing areas on carbon steel is effected by treatment with an aqueous solution containing 10% of sodium ferrocyanide and 1% of dextrin at the temperature of 20° C. for 5 minutes.

EXAMPLE 3

The plate preparation is conducted as in Example 1. Onto the dry surface of the plate there is applied a top layer containing, in percent by mass:

| | |
|---|---|
| ester of 2,1-naphthoquinonediazide(1)-3-carboxylic acid with 4,4'-dioxydiphenylolpropane | 5 |
| phenolformaldehyde novolac resin | 6.6 |
| butylated copolymer of styrene with maleic anhydride | 0.8 |
| 50% solution of epoxy resin in ethylcellosolve | 1.2 |
| resol-type phenolformaldehyde resin | 2.4 |
| ethylcellosolve | 42 |
| dimethylformamide | 42. |

The image transfer is carried out as described in Example 1.

The image development is effected by treatment with a 0.7% aqueous solution of trisodiumphosphate at a temperature of 20°–23° C. Hydrophilization of the non-printing areas on carbon steel is effected by treatment with an aqueous solution containing 7% of potassium ferricyanide and 0.5% of polyvinyl alcohol at the temperature of 30° C. for 5 minutes.

EXAMPLE 4

The plate preparation is carried out as in Example 1. Onto the dry surface on the plate a top layer is applied which has the following composition, in percent by mass:

| | |
|---|---|
| ester of 1,2-naphthoquinonediazide(2)-5-sulphonic acid with a novolac resin comprising a condensation product of 4,4'-dioxydiphenylolpropane with formaldehyde | 6 |
| phenolformaldehyde novolac resin | 7.8 |
| butylated copolymer of styrene with maleic anhydride | 0.4 |
| 50% solution of epoxy resin in ethylcellosolve | 0.6 |
| resol-type phenol-formaldehyde resin | 1.2 |
| ethylcellosolve | 42 |
| dimethylformamide | 42. |

The image transfer, its development and hydrophilization of the non-printing areas are conducted as described in Example 1.

EXAMPLE 5

Use is made of a carbon steel plate with the content of carbon of 0.15%. The plate preparation is conducted as in Example 1. Onto the dry surface of the plate a top layer is applied which has the following composition, in percent by mass:

| | |
|---|---|
| ester of 1,2-naphthoquinonediazide-(2)-4-sulphonic acid with 4,4'-dioxydiphenylolpropane | 5 |
| novolac phenylformaldehyde resin | 6.6 |
| butylated copolymer of styrene with maleic anhydride | 0.8 |
| 50% solution of epoxy resin in ethylcellosolve | 1.2 |
| resol-type phenolformaldehyde resin | 2.4 |
| ethylcellosolve | 42 |
| dimethylformamide | 42. |

The image transfer and development thereof are conducted as described in Example 1. Hydrophilization of the non-printing areas on carbon steel is conducted by treatment with an aqueous solution containing 5% of sodium cobaltocyanide and 1% of sodium salt of carboxymethylcellulose at a temperature of 35° to 40° C. for 3 minutes.

EXAMPLE 6

Preparation of a carbon-steel plate with the content of carbon of 0.15% is conducted as in Example 1. Onto the dry surface of the plate a top layer is applied which comprises a photopolymerizable composition containing the following ingredients, in percent by mass:

| | |
|---|---|
| copolymer of methylmethacrylate with methacrylic acid | 60 |
| pentaerythritol triacrylate | 13 |
| benzophenone | 5.4 |
| Michler's ketone | 0.12 |
| methylethylketone | 21.48. |

After drying of the top layer at a temperature within the range of from 50° to 60° C. for 10 minutes, the image is transferred from a negative onto the top layer, whereafter the image is developed by removing untanned regions of the top layer from the non-printing areas by treatment with a 0.2% aqueous solution of caustic potash at a temperature of from 23° to 25° C. Then hydrophilization of the non-printing areas is effected by treating with an aqueous solution containing 7% of potassium ferrocyanide and 1% of polyvinyl alcohol at a temperature of from 35° to 40° C. for 3 minutes.

EXAMPLE 7

Preparation of the plate, application of a top layer and the image transfer are conducted as described in the Example 6. The image development is effected by treatment with a 0.8% aqueous solution of sodium silicate at a temperature of from 18° to 22° C. Hydrophilization of the non-printing areas on carbon steel is conducted by means of an aqueous solution containing 10% of potassium cobaltcyanide and 0.5% of potassium salt of carboxymethylcellulose at a temperature of from 35° to 40° C.

EXAMPLE 8

Preparation of a carbon-steel plate with the content of carbon of 0.08% is effected as described in Example 1. Onto the dry plate surface a top layer is applied which has the following composition, in percent by mass:

| | |
|---|---|
| ester of 1,2-naphthoquinonediazide(2)-5-sulphonic acid with 4,4'-dioxydiphenylolpropane | 7.2 |
| novolac phenolformaldehyde resin | 8.8 |
| ethylcellosolve | 42 |
| dimethylformamide | 42. |

The image transfer and development, as well as hydrophilization of the non-printing areas are carried out as described in Example 1.

EXAMPLE 9

The plate preparation is effected as in Example 1. Onto the dry plate surface a top layer is applied which has the following composition, in percent by mass:

| | |
|---|---|
| ester of 2,1-naphthoquinonediazide(I)-3-carboxylic acid with 4,4'-dioxydiphenylolpropane | 13.5 |
| novolac phenolformaldehyde resin | 14.5 |
| ethylcellosolve | 36 |
| dimethylformamide | 36. |

The top layer drying and the image transfer onto the dried top layer are carried out as described in Example 1. The image development is conducted by treatment with a 0.5–0.7% aqueous solution of trisodiumphosphate. Hydrophilization of the non-printing areas on carbon steel is conducted by treatment with an aqueous solution containing 7% of potassium ferrocyanide and 2% of hydroxyethylcellulose at a temperature within the range of from 35° to 40° C. for 3 minutes.

EXAMPLE 10

The plate preparation is carried out as in Example 1. Onto the dry plate surface a top layer is applied which has the following composition, in percent by mass:

| | |
|---|---|
| ester of 1,2-naphthoquinonediazide(2)-5-sulphonic acid with a phenolformaldehyde novolac resin | 7.2 |
| novolac phenolformaldehyde resin | 8.8 |
| ethylcellosolve | 42 |
| dimethylformamide | 42. |

The image transfer and development, as well as hydrophilization of the non-printing areas is effected as in Example 1.

EXAMPLE 11

The preparation of the plate made of carbon steel with the content of carbon of 0.08% is carried out as in Example 1. Onto the dry plate surface a top layer is applied which has the following composition, in percent by mass:

| | |
|---|---|
| 1,2-naphthoquinonediazide-(I)-3-carboxylic acid octadecylamide | 10 |
| phenolformaldehyde novolac resin | 12 |
| ethylcellosolve | 39 |
| dimethylformamide | 39. |

The image transfer and development, as well as hydrophilization of the non-printing areas are conducted as in Example 1.

EXAMPLE 12

The plate preparation is conducted as in Example 1. Onto the dry plate surface there is applied a top layer which has the following composition, in percent by mass:

| | |
|---|---|
| 1,2-naphthoquinonediazide(I)-3-carboxylic acid octadecylamide | 5 |
| novolac phenolformaldehyde resin | 6.6 |
| butylated copolymer of styrene with maleic anhydride | 0.8 |
| 50% solution of epoxy resin in ethylcellosolve | 1.2 |
| resol-type phenolformaldehyde resin | 2.4 |
| ethylcellosolve | 42 |
| dimethylformamide | 42. |

The image copying and development, as well as hydrophilization of the non-printing areas is conducted as in Example 1.

EXAMPLE 13

Preparation of a carbon steel plate with the carbon content of 0.15% is conducted as in Example 1. Onto the dry plate surface a top layer is applied which has the following composition, in percent by mass:

| | |
|---|---|
| 1,2-naphthoquinonediazide(I)-3-carboxylicacid N—n)butylanilide | 6 |
| novolac phenolformaldehyde resin | 7.8 |
| butylated copolymer of styrene with maleic anhydride | 0.4 |
| 50% solution of epoxy resin in ethylcellosolve | 0.6 |
| resol-type phenolformaldehyde resin | 1.2 |
| ethylcellosolve | 42 |
| dimethylformamide | 42 |

The image transfer and development, as well as hydrophilization of the spacing members is conducted as in Example 1.

EXAMPLE 14

The plate preparation is conducted as in Example Onto the dry plate surface there is applied a top layer having the following composition, in percent by mass:

| | |
|---|---|
| 1,2-naphthoquinonediazide(I)-3-carboxylic acid N—benzylanilide | 5 |
| novolac phenolformaldehyde resin | 6.6 |
| butylated copolymer of styrene with maleic anhydride | 0.8 |
| 50% solution of epoxy resin in ethylcellosolve | 1.2 |
| phenolformaldehyde resol-type resin | 2.4 |
| ethylcellosolve | 42 |
| dimethylformamide | 42. |

The image transfer and development, as well as hydrophilization of the non-printing areas are carried out as described in Example 1.

The offset printing plates produced according to Examples 1 to 14 and according to the prior art processes described above, were tested following the known procedure by determining the contact wetting angle on the non-printing areas and the wear-resistance of the non-printing areas. The results obtained are shown in the following Table.

TABLE

| Kind of offset printing plate | Spacing members | Contact wetting angle on non-printing areas, degrees | Wear-resistance of the non-printings areas (volume of the ground-off material from a unit area), mm$^3$/cm$^2$ |
|---|---|---|---|
| Offset printing plate on aluminium substrate | On oxidized aluminium | 45–50 | 0.18 |
| Offset printing plate on a polymetallic sub- | On chromium | 40–45 | 0.045 |

TABLE-continued

| Kind of offset printing plate | Spacing members | Contact wetting angle on non-printing areas, degrees | Wear-resistance of the non-printings areas (volume of the ground-off material from a unit area), mm³/cm² |
|---|---|---|---|
| strate | | | |
| Offset printing plate on carbon-steel substrate | On carbon steel | 40–45 | 0.05 |

The test results given in the above Table verify the possibility of creation of stable non-printing areas on the surface of carbon steel.

As it is seen from the Table, the non-printing areas of the offset printing plate according to the present invention are characterized by a sufficiently low value of the contact wetting angle which points to a stable hydrophilization thereof. Furthermore, the non-printing areas on carbon steel have a high wear-resistance compared to the non-printing areas of multi-metal offset printing plates.

What is claimed is:

1. A method of making an offset printing plate which comprises applying onto a carbon steel substrate a light sensitive top layer based on derivatives of ortho-naphthoquinonediazidesulfonic acids, or derivatives of ortho-naphthoquinonediazidecarboxylic acids or a photopolymerizable composition; drying said top layer, transferring an image onto said dried top light sensitive layer by actinic radiation exposure through a diapositive when the light sensitive component is an ortho-naphthoquinonediazidesulfonic acid derivative or an ortho-naphthoquiononediazide-carboxylic acid derivative or through a negative when the light sensitive component is photopolymerizable; developing the image by treatment of the top layer with a 0.2–1.5% aqueous solution of an alkali metal salt or an alkali metal hydroxide at a temperature of about 18–25° C., thereby removing regions of the top layer from non-printing areas; and desensitizing the non-printing areas by treatment thereof with an aqueous solution consisting essentially of 0.5–2% of an organic hydrophilic colloid and 5–10% of a complex salt of an alkali metal and an inorganic cyanide complex.

2. The method of claim 1, wherein prior to the application of the light-sensitive top layer onto the carbon steel substrate, a butylated copolymer of styrene with maleic anhydride, a 50% solution of epoxy resin in ethylcellosolve and a resol-type phenolformaldehyde resin in a mass ratio therebetween of 1:1.5:3 respectively and in an amount of 2.2–4% by weight is added to the light sensitive top layer.

3. The method of claim 1 wherein the salt of an alkali metal and an inorganic cyanide complex is selected from the group consisting of ferrocyanides of sodium and potassium, ferricyanides of sodium and potassium and cobaltocyanides of sodium and potassium.

4. The method of claim 1, wherein the organic hydrophilic colloid is selected from the group consisting of polyvinyl alcohol, polysaccharides and cellulose derivatives.

5. The method of claim 4, wherein the polysaccharide is starch or dextrin.

6. The method of claim 4, wherein the cellulose derivative is sodium carboxymethylcellulose, potassium carboxymethylcellulose or hydroxyethylcellulose.

* * * * *